US012652978B2

(12) United States Patent
Wakahara

(10) Patent No.: US 12,652,978 B2
(45) Date of Patent: Jun. 9, 2026

(54) DEVICE WAFER PROCESSING METHOD

(71) Applicant: DISCO CORPORATION, Tokyo (JP)

(72) Inventor: Masatoshi Wakahara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 385 days.

(21) Appl. No.: 18/469,790

(22) Filed: Sep. 19, 2023

(65) Prior Publication Data

US 2024/0105458 A1    Mar. 28, 2024

(30) Foreign Application Priority Data

Sep. 27, 2022    (JP) ................................. 2022-153913

(51) Int. Cl.
    *H10P 50/24*        (2026.01)
    *H01J 37/32*        (2006.01)
    *H10P 52/00*        (2026.01)
    *H10P 72/70*        (2026.01)

(52) U.S. Cl.
    CPC ........ *H10P 50/242* (2026.01); *H01J 37/3244* (2013.01); *H10P 52/00* (2026.01); *H10P 72/7402* (2026.01); *H10P 72/7416* (2026.01); *H10P 72/7422* (2026.01)

(58) Field of Classification Search
    CPC ........... H01L 21/30655; H01L 21/3065; H01L 21/78; H01L 21/3043; B23K 26/00–70
    See application file for complete search history.

(56) References Cited

U.S. PATENT DOCUMENTS

| | | | |
|---|---|---|---|
| 2012/0322233 A1* | 12/2012 | Lei ...................... | B23K 26/364 257/E21.602 |
| 2014/0248758 A1* | 9/2014 | Weiss .................. | H01L 21/3043 438/463 |
| 2020/0098636 A1 | 3/2020 | Harikai et al. | |
| 2022/0199411 A1 | 6/2022 | Takasaki et al. | |

FOREIGN PATENT DOCUMENTS

| | | |
|---|---|---|
| JP | 2018098318 A | 6/2018 |
| JP | 2020-053473 A | 4/2020 |

OTHER PUBLICATIONS

Office Action issued in counterpart German patent application No. 10 2023 209 146.1, dated May 9, 2025.
Office Action issued in counterpart Japanese Patent Application No. 2022-153913, dated Mar. 17, 2026.

\* cited by examiner

*Primary Examiner* — Tucker J Wright
(74) *Attorney, Agent, or Firm* — GREER BURNS & CRAIN, LTD.

(57)    ABSTRACT

A device wafer processing method includes a protective film forming step of forming a protective film that covers a face side of a device wafer, a mask forming step of, after the protective film forming step is carried out, applying a laser beam along streets and forming, in the protective film, a mask that has grooves extending along the streets, a device layer plasma etching step of, after the mask forming step is carried out, performing plasma etching on a device layer of the device wafer by device layer gas through the mask, and a base member plasma etching step of, after the device layer plasma etching step is carried out, performing plasma etching on the base member by base member gas through the mask.

11 Claims, 14 Drawing Sheets

DEVICE WAFER PROCESSING METHOD

BACKGROUND OF THE INVENTION

Field of the Invention

The present invention relates to a device wafer processing method.

Description of the Related Art

In recent years, in association with higher integration of devices, hybrid bonding, which is a method of connecting electrodes formed on face sides of devices to each other, has come into use. In hybrid bonding, since the face sides of the devices are bonded to each other, adherence of foreign matter to the face sides of the devices could cause bonding failures.

Hence, a method of singulating the wafer into individual devices by plasma etching, for example, is examined as a method of singulating the wafer into devices which are to be subjected to hybrid bonding (see, for example, Japanese Patent Laid-open No. 2018-098318).

SUMMARY OF THE INVENTION

In the wafer processing method described in Japanese Patent Laid-open No. 2018-098318, a face side of a device wafer is covered with water-soluble resin, and a laser beam is applied, thus removing a protective film and a device layer along streets and forming a mask to be used at the time of plasma etching.

However, when laser processing grooves are formed by laser beam application, debris of the device layer is formed on edges of the laser processing grooves. The debris extends in a manner protruding upward from an upper surface of the device layer, posing a problem in bonding of the devices in subsequent hybrid bonding.

It is accordingly an object of the present invention to provide a device wafer processing method that can restrain debris from protruding from an upper surface of a device layer.

In accordance with an aspect of the present invention, there is provided a device wafer processing method for a device wafer in which a device layer configuring devices is stacked on a base member and which has each of the devices formed in each of areas on a face side demarcated by a plurality of streets in crisscross relation, the method including a protective film forming step of forming a protective film that covers the face side of the device wafer, a mask forming step of, after the protective film forming step is carried out, applying a laser beam along the streets and forming, in the protective film, a mask that has grooves extending along the streets, a device layer plasma etching step of, after the mask forming step is carried out, performing plasma etching on the device layer of the device wafer by device layer gas through the mask, and a base member plasma etching step of, after the device layer plasma etching step is carried out, performing plasma etching on the base member by base member gas through the mask.

Preferably, in the device layer plasma etching step, etching grooves that do not reach an upper surface of the base member are formed in the device layer, and a remaining portion of the device layer is formed on a lower side of each of the etching grooves, and the device wafer processing method further includes a laser processing step of, after the device layer plasma etching step is carried out but before the base member plasma etching step is performed, applying a laser beam to the remaining portion of the device layer and forming laser processing grooves that divide the remaining portion and that reach the base member. Further, preferably, a groove width of each of the laser processing grooves is formed to be narrower than a groove width of each of the etching grooves, and a depth of each of the etching grooves is set to such a depth that debris formed in the laser processing step does not protrude from an upper surface of the device layer.

The present invention produces such an effect of restraining debris from protruding from an upper surface of a device layer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The details described in the following embodiments by no means limit the present invention. Further, the constituent elements described below include those that can easily be conceived of by those skilled in the art and those that are substantially the same. Moreover, the configurations described below can be combined as appropriate. Furthermore, various omissions, replacements, or modifications of the configuration can be performed within the scope not departing from the gist of the present invention.

Figure 1:
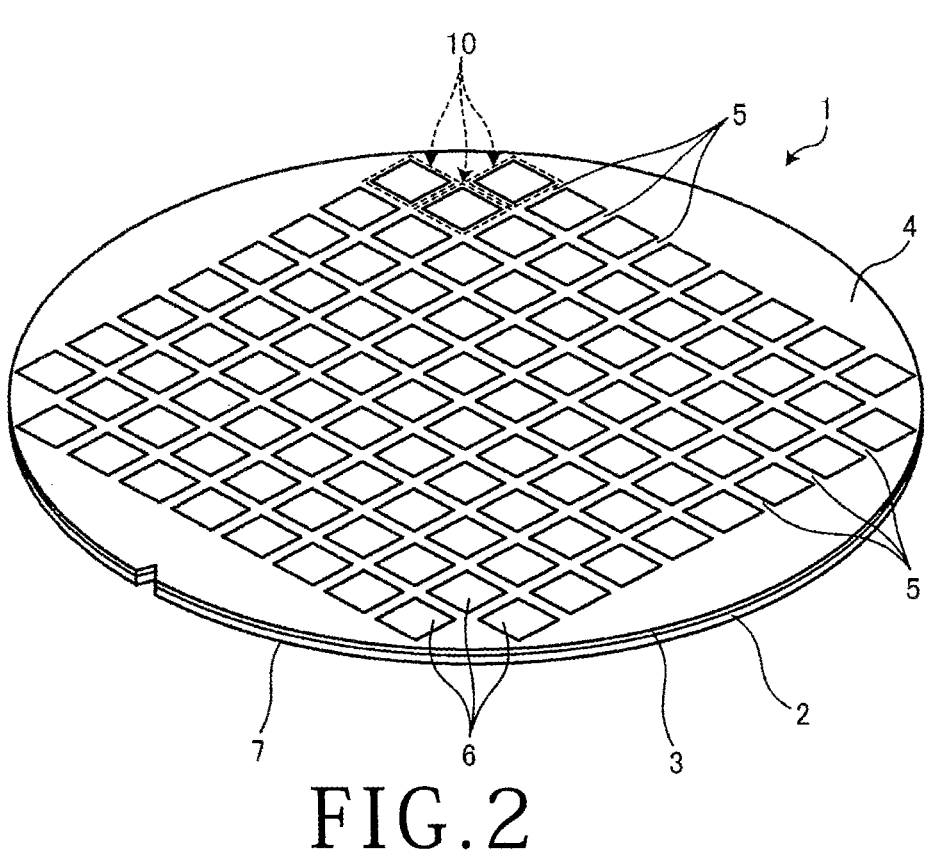
FIG. 1 is a perspective view illustrating an example of a workpiece that is to be processed by a device wafer processing method according to a first embodiment of the present invention.
Figure 2:
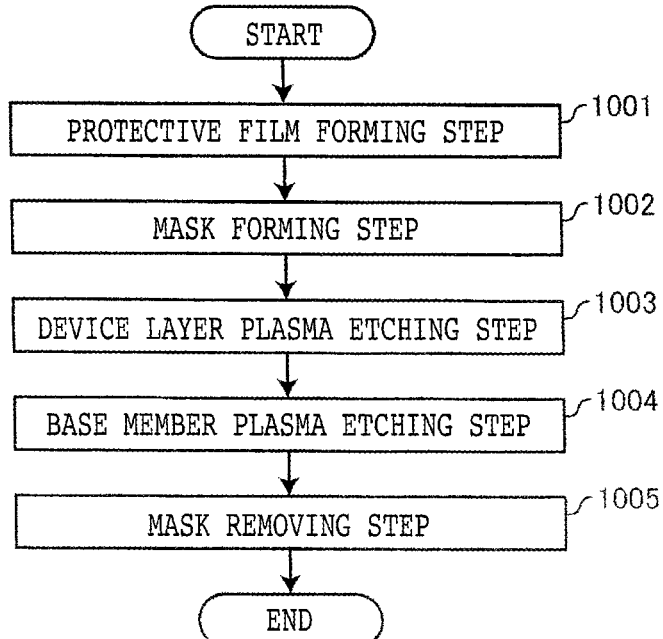
FIG. 2 is a flowchart illustrating a flow of the device wafer processing method according to the first embodiment.

A device wafer processing method according to a first embodiment of the present invention will be described in reference to the drawings. FIG. 1 is a perspective view illustrating an example of a workpiece to be processed by the device wafer processing method according to the first embodiment. FIG. 2 is a flowchart illustrating a flow of the device wafer processing method according to the first embodiment.

The device wafer processing method according to the first embodiment is a device wafer processing method for a device wafer 1 illustrated in FIG. 1. In the first embodiment, the device wafer 1 is such a wafer as a semiconductor wafer which includes a base member 2 formed of silicon or the like and in which a device layer 3 is stacked on the base member 2. As illustrated in FIG. 1, the device wafer 1 has devices 6 formed in the areas of a face side 4 demarcated in a grid pattern by a plurality of streets 5 in crisscross relation.

Each of the devices 6 is, for example, an integrated circuit device such as an integrated circuit (IC) or a large scale integration (LSI) circuit or a memory (semiconductor storage device). In the first embodiment, the device layer 3 includes, for example, a plurality of interlayer dielectric films formed of $SiO_2$ and stacked one on another and a circuit layer formed of conductive metal and disposed between the interlayer dielectric films.

The device 6 is configured by the interlayer dielectric films and the circuit layer of the device layer 3 being stacked one on the other. Note that, in the streets 5, the device layer 3 is formed of only the interlayer dielectric films. Further, the device 6 has unillustrated electrodes formed on its face side. Each of the electrodes is flat, and in the first embodiment, is preferably positioned to be flush with the face side of the device 6. The electrode includes conductive metal such as a copper alloy and is used to connect the device 6 of the device wafer 1 with a device of another wafer or a device of a device chip.

Specifically, in the first embodiment, the device wafer 1 is a wafer in which a device of another wafer or a device of a device chip is superposed on the device 6 and the electrodes of the device 6 are bonded to the electrodes of the device of the other wafer or the device of the relevant device chip. As described above, in the first embodiment, the device wafer 1 to be processed is a wafer that is to be subjected to what is generally called hybrid bonding. However, the wafer to which the present invention is applicable is not limited to a wafer that is to be subjected to hybrid bonding.

The device wafer processing method according to the first embodiment is a method of dividing the device wafer 1 into individual device chips 10 along the streets 5. Note that each of the device chips 10 includes part of the base member 2 and the device 6 on the base member 2.

The device wafer processing method according to the first embodiment is a method of dividing the device wafer 1 into device chips 10 by plasma etching, that is, a method of dividing the device wafer 1 into device chips 10 by what is generally called plasma dicing. As illustrated in FIG. 2, the device wafer processing method according to the first embodiment includes a protective film forming step 1001, a mask forming step 1002, a device layer plasma etching step 1003, a base member plasma etching step 1004, and a mask removing step 1005.

(Protective Film Forming Step)

Figure 3:
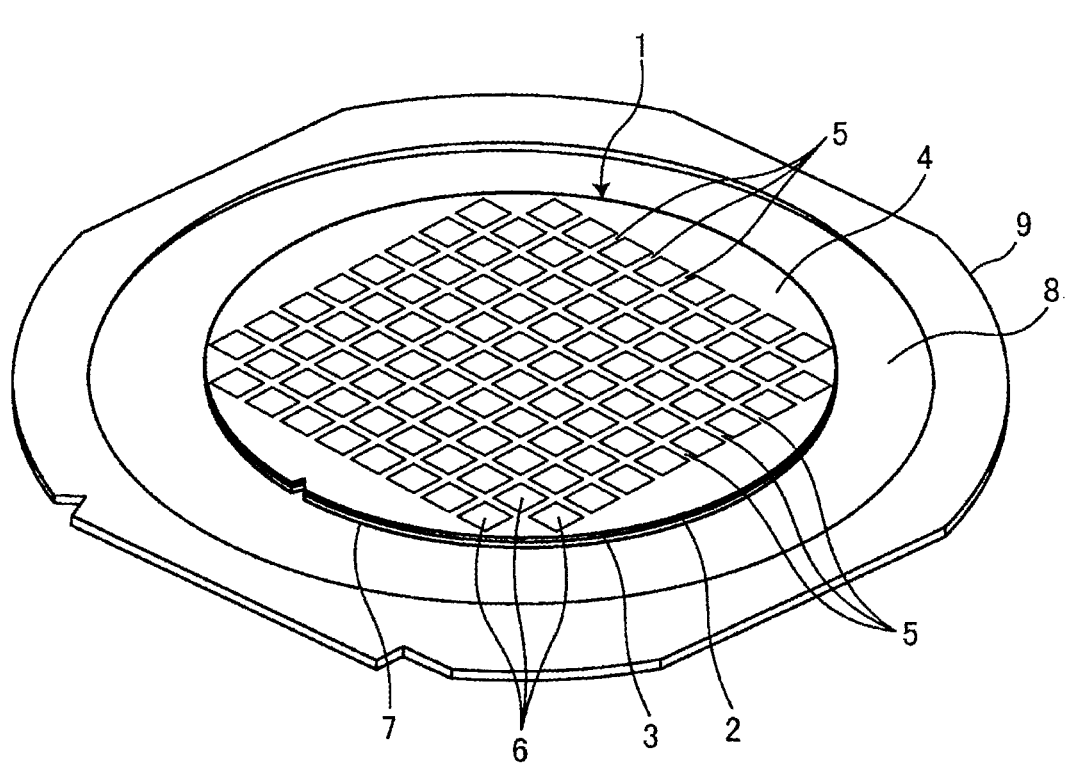
FIG. 3 is a perspective view schematically illustrating a state in which a tape is affixed to a reverse side of a device wafer and an annular frame is affixed to an outer edge portion of the tape in a protective film forming step of the device wafer processing method illustrated in FIG. 2.
Figure 4:
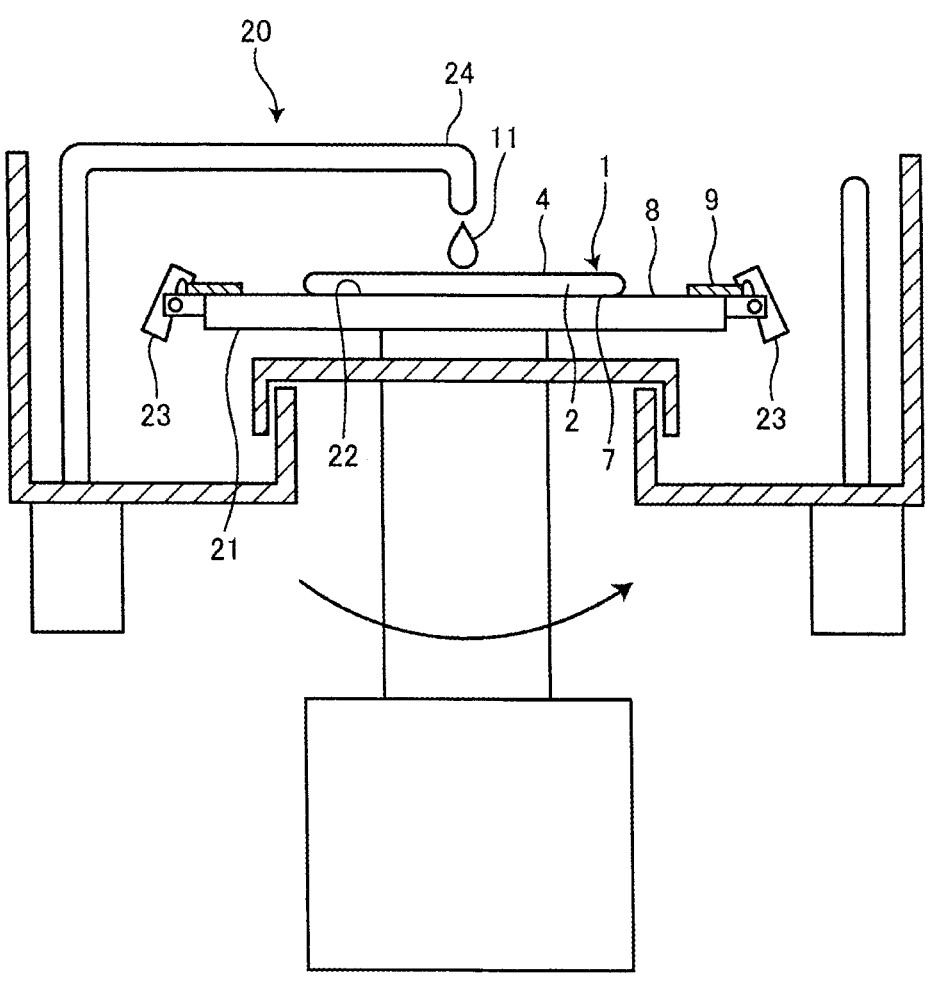
FIG. 4 is a schematic cross-sectional side view illustrating a state in which water-soluble resin is applied to an entire face side of the device wafer in the protective film forming step of the device wafer processing method illustrated in FIG. 2.
Figure 5:
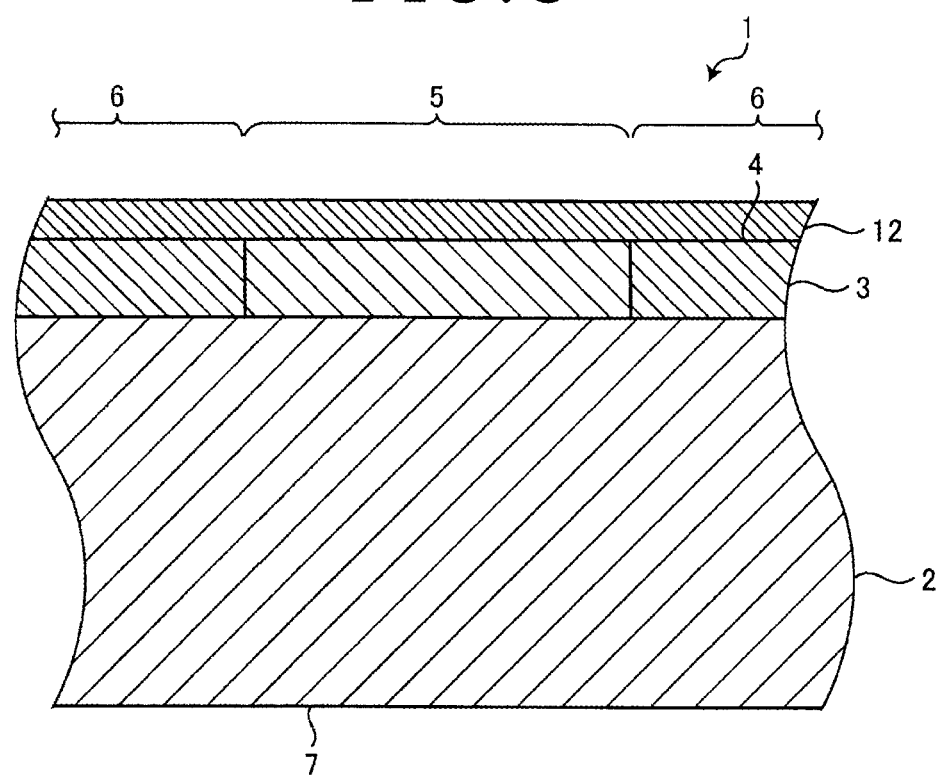
FIG. 5 is a cross sectional view schematically illustrating part of the device wafer which has a protective film formed on the face side thereof in the protective film forming step of the device wafer processing method illustrated in FIG. 2.

FIG. 3 is a perspective view schematically illustrating a state in which a tape is affixed to a reverse side of a device wafer and an annular frame is affixed to an outer edge portion of the tape in a protective film forming step of the device wafer processing method illustrated in FIG. 2. FIG. 4 is a schematic cross-sectional side view illustrating a state in which water-soluble resin is applied to an entire face side of the device wafer in the protective film forming step of the device wafer processing method illustrated in FIG. 2. FIG. 5 is a cross sectional view schematically illustrating part of the device wafer that has a protective film formed on the face side thereof in the protective film forming step of the device wafer processing method illustrated in FIG. 2. Note that the device layer 3 is omitted from illustration in FIG. 4.

The protective film forming step 1001 is a step of forming a protective film 12 that covers the entire face side 4 of the device wafer 1. In the protective film forming step 1001 according to the first embodiment, first, as illustrated in FIG. 3, a central portion of a circular plate-shaped tape 8 which is larger in diameter than the device wafer 1 is affixed to a reverse side 7 of the device wafer 1, and an annular frame 9 which has an internal diameter larger than the outer diameter of the device wafer 1 is affixed to an outer edge portion of the tape 8. Note that, in the first embodiment, the tape 8 is either an adhesive tape including a base material configured from resin that is non-adhesive but flexible and a glue layer stacked on the base material and configured from resin that is adhesive and flexible, in which the glue layer is affixed to the device wafer 1 and the annular frame 9, or a sheet that includes no glue layer and is configured from only the base material including thermoreversible resin and being thermocompression bonded to the device wafer 1 and the annular frame 9.

In the protective film forming step 1001 according to the first embodiment, a protective film coating apparatus 20 illustrated in FIG. 4 places the reverse side 7 of the device wafer 1 on a holding surface 22 of a spinner table 21 via the tape 8, holds the reverse side 7 of the device wafer 1 under suction on the holding surface 22 via the tape 8, and clamps the annular frame 9 by clamps 23 provided around the spinner table 21. In the protective film forming step 1001 according to the first embodiment, as illustrated in FIG. 4, the protective film coating apparatus 20 applies water-soluble resin 11 in liquid form to a center of the face side 4 of the device wafer 1 from an application nozzle 24 disposed on an upper side of the device wafer 1, while rotating the spinner table 21 about its axis. Then, the water-soluble resin 11 applied to the face side 4 of the device wafer 1 spreads toward an outer edge side of the device wafer 1 by the centrifugal force generated by rotation of the spinner table 21 and covers the entire face side 4 of the device wafer 1.

In this manner, in the protective film forming step 1001 according to the first embodiment, the water-soluble resin 11 is applied by what is generally called spin coating of supplying and applying the water-soluble resin 11 to the device wafer 1 held on the spinner table 21 that is rotating about its axis. In the protective film forming step 1001 according to the first embodiment, the water-soluble resin 11 is dried, and the protective film 12 that covers the entire face side 4 of the device wafer 1 is formed, as illustrated in FIG. 5.

Note that, in the first embodiment, the water-soluble resin 11 includes, for example, such water-soluble resin as poly-vinyl alcohol (PVA) or polyvinylpyrrolidone (PVP). Further, the protective film 12 configured from the water-soluble resin 11 has resistance to device layer gas 581 that has been turned into plasma gas and that is used in the device layer plasma etching step 1003 and base member gas 582 that has been turned into plasma gas and that is used in the base member plasma etching step 1004. Further, the water-soluble resin 11 according to the first embodiment has dispersed therein light absorbing materials that absorb a laser beam 36 which has a wavelength of 355 nm and which is applied in the mask forming step 1002, but the water-soluble resin 11 according to the present invention is not required to include light absorbing materials. As the light absorbing material, for example, carbon black or phthalo-cyanine is used.

The protective film 12 formed on the entire face side 4 of the device wafer 1 by the water-soluble resin 11 being dried is configured from the water-soluble resin 11 described above, and thus, the protective film 12 is configured from a material that has resistance to the device layer gas 581 that has been turned into plasma gas and that is used in the device layer plasma etching step 1003 and the base member gas 582 that has been turned into plasma gas and that is used in the base member plasma etching step 1004, and is formed to have a uniform thickness that has resistance to the gas 581 and the gas 582 that have each been turned into plasma gas.

(Mask Forming Step)

Figure 6:
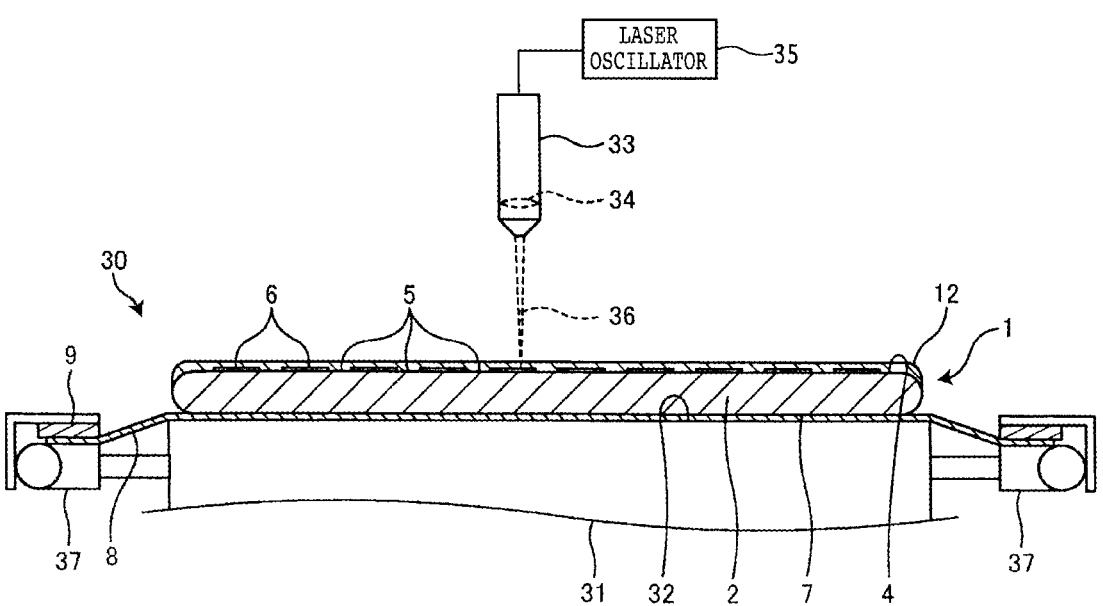
FIG. 6 is a schematic cross-sectional side view illustrating a mask forming step of the device wafer processing method illustrated in FIG. 2.
Figure 7:
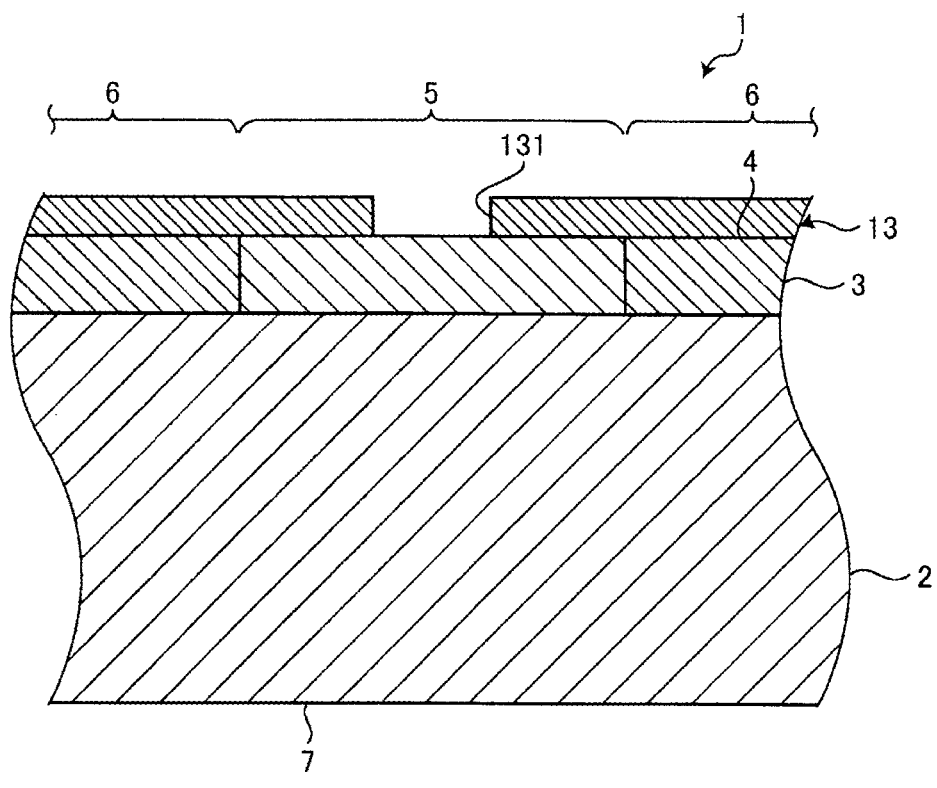
FIG. 7 is a cross sectional view schematically illustrating part of the device wafer that has undergone the mask forming step of the device wafer processing method illustrated in FIG. 2.

FIG. 6 is a schematic cross-sectional side view illustrating the mask forming step of the device wafer processing method illustrated in FIG. 2. FIG. 7 is a cross sectional view schematically illustrating part of the device wafer that has undergone the mask forming step of the device wafer processing method illustrated in FIG. 2. Note that the device layer 3 is omitted from illustration in FIG. 6. The mask forming step 1002 is a step of, after the protective film forming step 1001 is carried out, applying the laser beam 36 (illustrated in FIG. 6) along the streets 5 and forming, in the protective film 12, a mask 13 (illustrated in FIG. 7), in which a groove or opening 131 (illustrated in FIG. 7) extending along the street 5 is formed.

In the mask forming step 1002 according to the first embodiment, a laser processing apparatus 30 illustrated in FIG. 6 holds the reverse side 7 of the device wafer 1 under suction on a holding surface 32 of a chuck table 31 via the tape 8 and clamps the annular frame 9 by clamps 37 provided around the chuck table 31. In the mask forming step 1002 according to the first embodiment, the laser processing apparatus 30 captures an image of the face side 4 of the device wafer 1 by an imaging camera and performs alignment of aligning the positions of the streets 5 of the device wafer 1 and a condenser lens 34 of a laser beam application unit 33.

In the mask forming step 1002 according to the first embodiment, as illustrated in FIG. 7, the laser processing apparatus 30 sets, while moving the chuck table 31 and the laser beam application unit 33 relative to each other along the streets 5, a focal point of the laser beam 36 to a face side of the protective film 12 on each of the streets 5 and applies the laser beam 36 having a wavelength (for example, 355 nm) absorbable by the protective film 12 and being emitted from a laser oscillator 35, toward the protective film 12 on each of the streets 5, to thereby remove the protective film 12 on each of the streets 5. In the mask forming step 1002 according to the first embodiment, the laser processing apparatus 30 forms the grooves or openings 131 that extend along the streets 5 over the entire length of each of the streets 5 and forms, in the protective film 12, the mask 13 in which each of the grooves or openings 131 illustrated in FIG. 7 is formed. Note that the grooves or openings 131 have the streets 5 exposed on the bottoms thereof.

Note that, in the mask forming step 1002 according to the first embodiment, the protective film 12 on the streets 5 is removed in whole in the thickness direction by the laser processing apparatus 30, but according to the present invention, the protective film 12 may slightly be left at the bottom of the groove or opening 131. Note that the protective film 12 slightly left at the bottom of the groove or opening 131 is etched and removed in the next device layer plasma etching step 1003. In this manner, in the mask forming step 1002 according to the present invention, the laser processing apparatus 30 removes the protective film 12 on each of the streets 5 and applies the laser beam 36 to the device wafer 1 under such processing conditions that removal of the device layer 3 on each of the streets 5 is restricted, to thereby form the mask 13 on the device wafer 1.

(Plasma Etching Apparatus)

Figure 8:
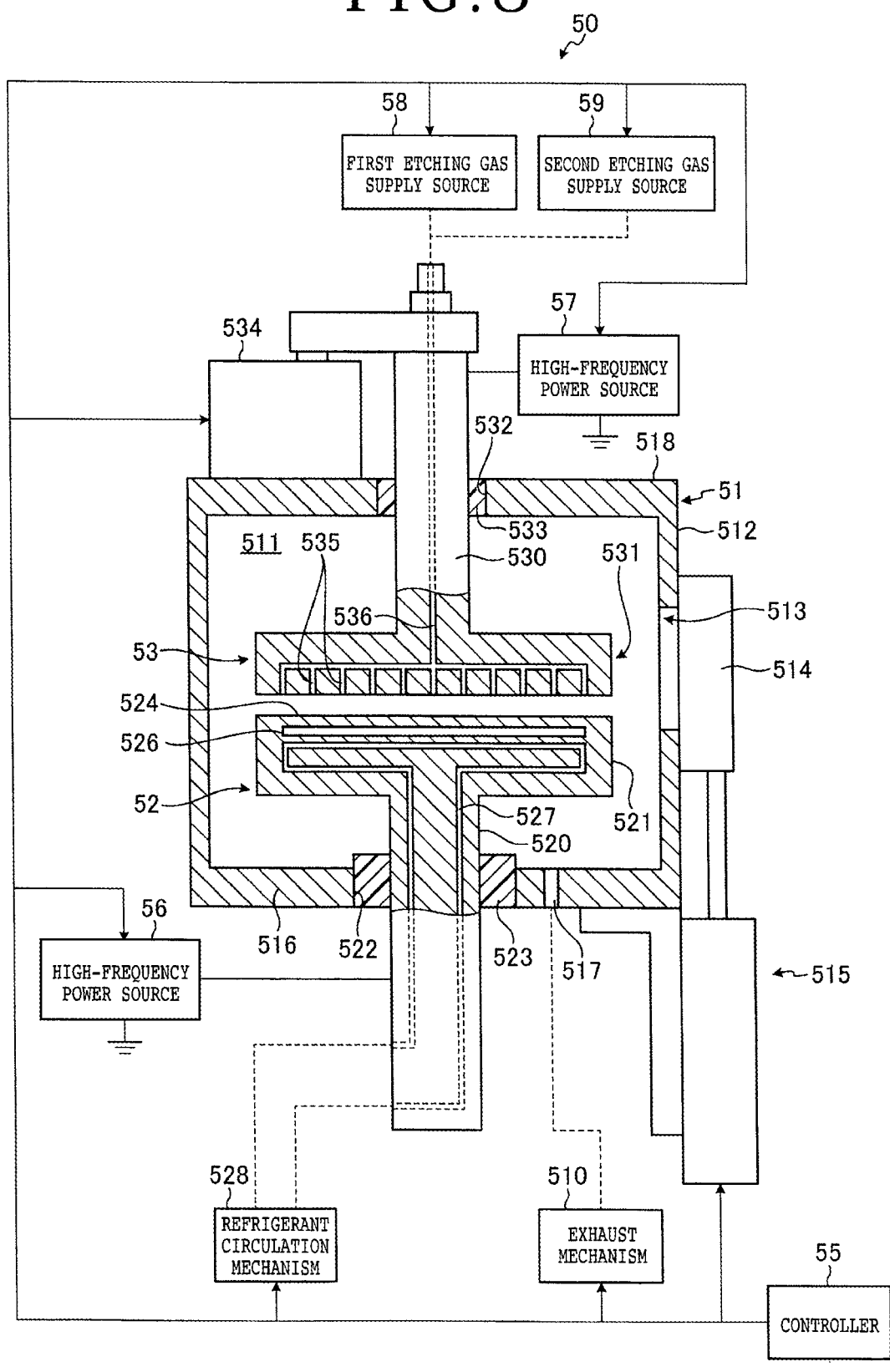
FIG. 8 is a cross sectional view schematically illustrating a configuration example of a plasma etching apparatus that performs a device layer plasma etching step and a base member plasma etching step of the device wafer processing method illustrated in FIG. 2.

Next, a plasma etching apparatus 50 that performs the device layer plasma etching step 1003 and the base member plasma etching step 1004 will be described in reference to the drawings. FIG. 8 is a cross sectional view schematically illustrating a configuration example of the plasma etching apparatus that performs the device layer plasma etching step and the base member plasma etching step of the device wafer processing method illustrated in FIG. 2. The plasma etching apparatus 50 includes, as illustrated in FIG. 8, a parallelepiped chamber 51, a holding unit 52, an upper electrode 53, and a controller 55.

The chamber 51 has in its inside a processing space 511 in which plasma etching is performed. The chamber 51 is provided, on one side wall 512, a groove or opening 513 for loading and unloading the device wafer 1 and an opening/closing door 514 for opening or closing the groove or opening 513. The opening/closing door 514 opens or closes the groove or opening 513 by being lifted or lowered by an opening/closing mechanism 515 including an air cylinder, for example.

Further, the chamber 51 is provided with an exhaust port 517 on a bottom wall 516. The exhaust port 517 establishes communication between the inside and outside of the chamber 51. The exhaust port 517 is connected to an exhaust mechanism 510 such as a vacuum pump.

The holding unit 52 and the upper electrode 53 are disposed in a manner facing each other in the processing space 511 of the chamber 51. An upper surface of the holding unit 52 is a holding surface 524 for holding the device wafer 1 via the tape 8. Further, the holding unit 52 is configured from a conductive material and functions also as a lower electrode.

The holding unit 52 includes a disk-shaped holding portion 521 and a cylindrical support portion 520 that is protruding downward from a central part on a lower surface of the holding portion 521. The support portion 520 is inserted into a groove or opening 522 formed in the bottom wall 516 of the chamber 51. In the groove or opening 522, an annular insulating member 523 is disposed between the bottom wall 516 and the support portion 520, and the chamber 51 and the holding unit 52 are electrically insulated from each other. Further, the holding unit 52 is connected to a high-frequency power source 56 outside the chamber 51.

Provided in the holding portion 521 of the holding unit 52 is an electrode 526 connected to an unillustrated high-frequency power source. When electric power is applied from the high-frequency power source to the electrode 526, a dielectric polarization phenomenon occurs between the holding surface 524 and the device wafer 1, and the holding unit 52 holds under attraction the device wafer 1 on the holding surface 524 by electrostatic attractive force generated by polarization of charges.

Further, inside the holding portion 521 and the support portion 520 of the holding unit 52, there is formed a cooling channel 527 in which a cooling fluid for cooling the holding unit 52 flows. Both ends of the cooling channel 527 are connected to a refrigerant circulation mechanism 528. When the refrigerant circulation mechanism 528 is operated, a cooling fluid, as exemplified by water, circulates and flows inside the cooling channel 527 and cools the holding unit 52.

The upper electrode 53 is formed of a conductive material and includes a disk-shaped gas jetting portion 531 and a cylindrical support portion 530 that is protruding upward from a central part on an upper surface of the gas jetting portion 531. The support portion 530 is inserted into a groove or opening 532 that is formed in an upper wall 518 of the chamber 51. Inside the groove or opening 532, an annular insulating member 533 is disposed between the upper wall 518 and the support portion 530, and the chamber 51 and the upper electrode 53 are electrically insulated from each other.

The upper electrode 53 is connected to a high-frequency power source 57 outside the chamber 51. To an upper end portion of the support portion 530, a support arm of a lifting/lowering mechanism 534 is attached. The upper electrode 53 is lifted and lowered by the lifting/lowering mechanism 534.

On a lower surface side of the gas jetting portion 531, a plurality of jetting ports 535 are provided. The jetting ports 535 are connected to a first etching gas supply source 58 and a second etching gas supply source 59 via a flow channel 536 formed in the gas jetting portion 531 and the support portion 530. The first etching gas supply source 58 supplies the gas 581 and the gas 582 to the inside of the chamber 51 from the jetting ports 535 through the flow channel 536. In the first embodiment, the first etching gas supply source 58 supplies, as the gas 581 and the gas 582, fluorine-based gas to the inside of the chamber 51, in a case where the base member 2 of the device wafer 1 is composed of silicon. The second etching gas supply source 59 supplies etching gas to the inside of the chamber 51 from the jetting ports 535 through the flow channel 536. In the first embodiment, the second etching gas supply source 59 supplies, as the gas, oxygen gas to the inside of the chamber 51.

The controller 55 controls the components of the plasma etching apparatus 50 and causes the plasma etching apparatus 50 to perform plasma etching on the device wafer 1. Note that the controller 55 is a computer including an arithmetic processing device having a microprocessor, as exemplified by a central processing unit (CPU), a storage device having a memory, as exemplified by a read only memory (ROM) or a random access memory (RAM), and an input/output interface device. The arithmetic processing device of the controller 55 performs arithmetic processing in accordance with a computer program stored in the storage device and outputs, to the components of the plasma etching apparatus 50 via the input/output interface device, control signals for controlling the plasma etching apparatus 50.

Further, the controller 55 is connected to a display unit configured of a liquid crystal display device or the like that displays various kinds of information, images, and the like and an input unit used by an operator for registering processing content information and the like. The input unit includes at least one of a touch panel provided on the display unit or an external input device such as a keyboard.

(Device Layer Plasma Etching Step)

Figure 9:
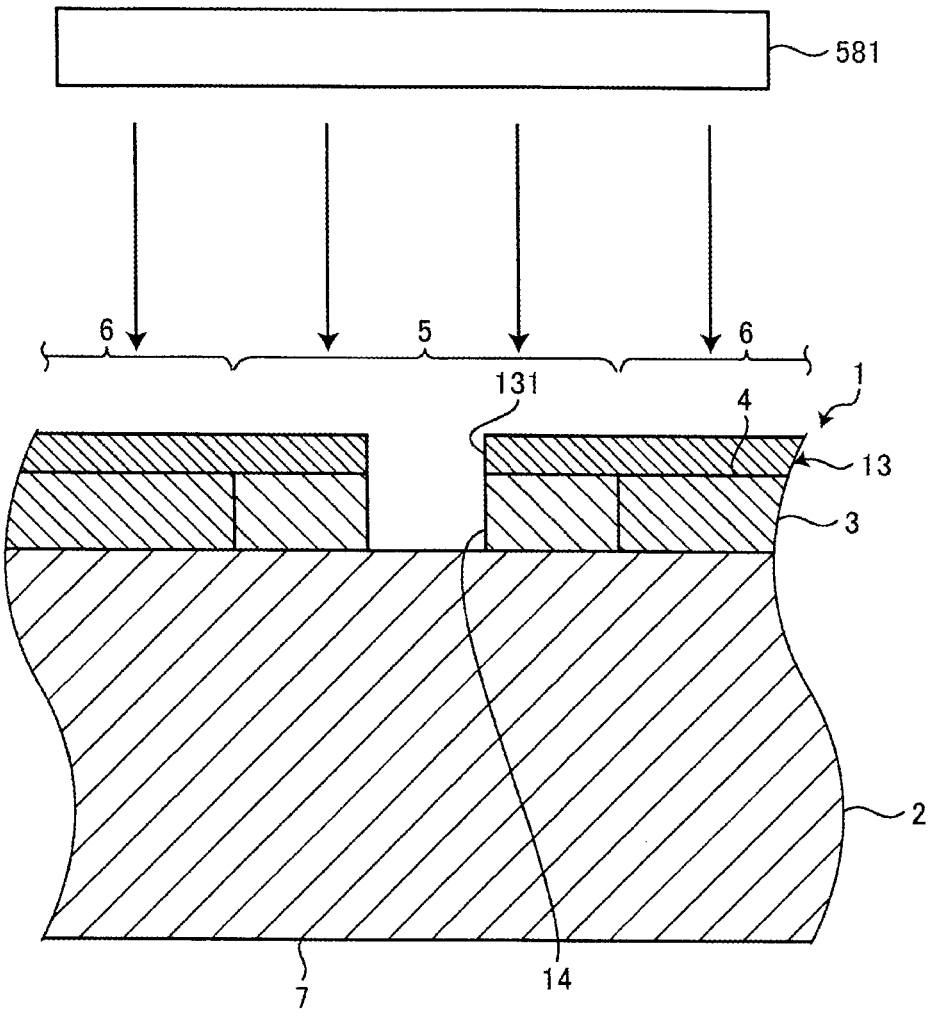
FIG. 9 is a cross sectional view of part of the device wafer schematically illustrating the device layer plasma etching step of the device wafer processing method illustrated in FIG. 2.

FIG. 9 is a cross sectional view of part of the device wafer schematically illustrating the device layer plasma etching step of the device wafer processing method illustrated in FIG. 2. The device layer plasma etching step 1003 is a step of, after the mask forming step 1002 is carried out, performing plasma etching on the device layer 3 of the device wafer 1 through the mask 13 by the device layer gas 581 (which is equivalent to etching gas) that has been turned into plasma gas.

In the device layer plasma etching step 1003 according to the first embodiment, the plasma etching apparatus 50 raises the upper electrode 53 by the lifting/lowering mechanism 534, and then lowers the opening/closing door 514 by the opening/closing mechanism 515 in a state in which a frame clamping plate 542 is raised by a lifting/lowering mechanism, to open the groove or opening 513.

In the device layer plasma etching step 1003, the plasma etching apparatus 50 causes an unillustrated delivery unit to load the device wafer 1 in which the mask 13 is formed in the mask forming step 1002 to the inside the processing space 511 and places the reverse side 7 of the device wafer 1 on the holding surface 524 of the holding unit 52 via the tape 8. In the device layer plasma etching step 1003, the plasma etching apparatus 50 causes the high-frequency power source to apply electric power to the electrode 526 and holds under attraction the reverse side 7 of the device wafer 1 on the holding surface 524 via the tape 8.

In the device layer plasma etching step 1003, the plasma etching apparatus 50 causes the opening/closing mechanism 515 to raise the opening/closing door 514 and close the groove or opening 513 and operates the exhaust mechanism 510 to reduce the pressure inside the chamber 51 and realize a vacuumed state (low pressure state) in the processing space 511. The plasma etching apparatus 50 further operates the refrigerant circulation mechanism 528 to circulate the cooling fluid, as exemplified by water, inside the cooling channel 527 and thereby restrain the holding unit 52 from abnormally rising in temperature. In the device layer plasma etching step 1003, the plasma etching apparatus 50 causes the lifting/lowering mechanism 534 to lower the upper electrode 53 and adjusts the distance between the lower surface of the upper electrode 53 and the device wafer 1 held by the holding unit 52 configuring the lower electrode to a predetermined interelectrode distance suitable for plasma etching.

In the device layer plasma etching step 1003, the plasma etching apparatus 50 supplies the device layer gas 581 from the first etching gas supply source 58 at a predetermined flow rate and jets the device layer gas 581 toward the device wafer 1 held on the holding unit 52 from the plurality of jetting ports 535 of the gas jetting portion 531. In the device layer plasma etching step 1003, the plasma etching apparatus 50 applies, in a state in which the device layer gas 581 is being supplied from the first etching gas supply source 58, high-frequency power that generates and maintains plasma to the upper electrode 53 from the high-frequency power source 57 and further applies high-frequency power for attracting ion, to the holding unit 52 serving as the lower electrode, from the high-frequency power source 56.

In the device layer plasma etching step 1003, the device layer gas 581 present in the space between the holding unit 52 and the upper electrode 53 is turned into plasma gas in the plasma etching apparatus 50, and as illustrated in FIG. 9, the device layer gas 581 thus turned into plasma gas is attracted to the device wafer 1 side and etches (subjects to what is generally called plasma etching) the face side 4 on the streets 5 exposed from the groove or opening 131 of the mask 13 on the device wafer 1. In the device layer plasma etching step 1003, the plasma etching apparatus 50 forms etching grooves 14 (illustrated in FIG. 9) in the device layer 3 on the streets 5 and causes the etching grooves 14 to advance toward the reverse side 7 of the device wafer 1. In this manner, in the device layer plasma etching step 1003 according to the first embodiment, plasma etching is performed on the device layer 3 of the device wafer 1 through the mask 13.

Note that, in the first embodiment, in the case where the device layer 3 on the streets 5 is formed of $SiO_2$, fluorine-based gas, as exemplified by $CF_4$, is used as the device layer gas 581, but according to the present invention, $C_4F_8$ may alternatively be used. In the device layer plasma etching step 1003 according to the first embodiment, the plasma etching apparatus 50 has a predetermined length of time set in advance for subjecting the device layer 3 of the device wafer 1 to plasma etching, according to the thickness of the device layer 3 of the device wafer 1.

In the device layer plasma etching step 1003, the plasma etching apparatus 50 applies high-frequency power to the holding unit 52 and the upper electrode 53 while supplying the device layer gas 581, for a predetermined length of time, and, as illustrated in FIG. 9, completely removes the device layer 3 exposed from the groove or opening 131 of the mask 13 on the street 5, thereby dividing the device layer 3 of the device wafer 1 along the groove or opening 131, that is, the etching groove 14. In other words, in the device layer plasma etching step 1003, the plasma etching apparatus 50 removes the device layer 3 on each street 5 of the device wafer 1 over its entire length.

(Base Member Plasma Etching Step)

Figure 10:
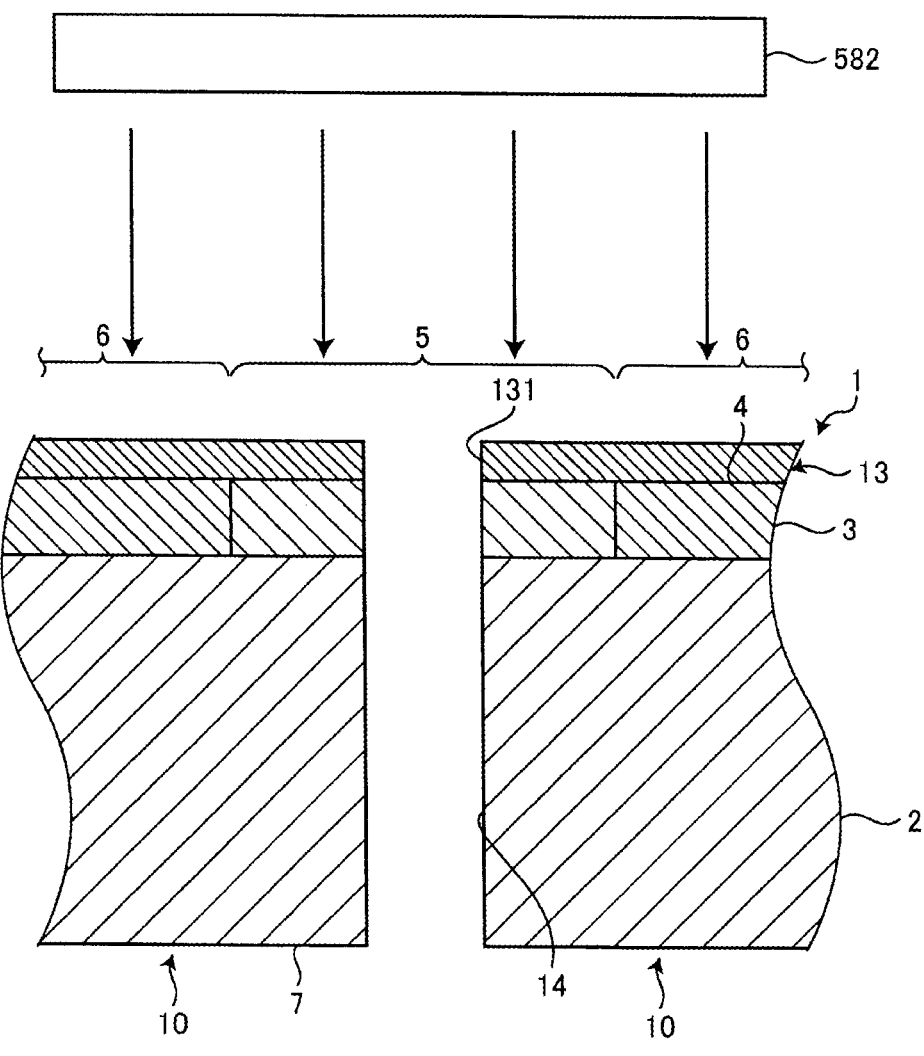
FIG. 10 is a cross sectional view of part of the device wafer schematically illustrating the base member plasma etching step of the device wafer processing method illustrated in FIG. 2.

FIG. 10 is a cross sectional view of part of the device wafer schematically illustrating the base member plasma etching step of the device wafer processing method illustrated in FIG. 2. The base member plasma etching step 1004 is a step of, after the device layer plasma etching step 1003 is carried out, performing plasma etching on the base member 2 of the device wafer 1 through the mask 13 by the base member gas 582 (which is equivalent to etching gas) that has been turned into plasma gas.

In the base member plasma etching step 1004, the plasma etching apparatus 50 supplies the base member gas 582 from the first etching gas supply source 58 at a predetermined flow rate and jets the base member gas 582 toward the device wafer 1 held on the holding unit 52 from the plurality of jetting ports 535 of the gas jetting portion 531. In the base member plasma etching step 1004, the plasma etching apparatus 50 applies, in a state in which the base member gas 582 is supplied from the first etching gas supply source 58, high-frequency power that generates and maintains plasma to the upper electrode 53 from the high frequency power source 57 and applies high-frequency power for attracting ion, to the holding unit 52 serving as the lower electrode, from the high-frequency power source 56.

In the base member plasma etching step 1004, the base member gas 582 present in the space between the holding unit 52 and the upper electrode 53 is turned into plasma gas in the plasma etching apparatus 50, and as illustrated in FIG. 10, the base member gas 582 thus turned into plasma gas is attracted to the device wafer 1 side and etches (subjects to what is generally called plasma etching) the bottom of the etching groove 14 exposed from the groove or opening 131 of the mask 13 of the device wafer 1, that is, the base member 2. In the base member plasma etching step 1004, the plasma etching apparatus 50 causes the etching groove 14 to advance toward the reverse side 7 of the device wafer 1. As described above, in the base member plasma etching step 1004 according to the first embodiment, plasma etching is performed on the base member 2 of the device wafer 1 through the mask 13.

Note that, in the first embodiment, in a case where the base member 2 is composed of silicon, the base member gas 582 to be used is such fluorine-based gas as $SF_6$, $C_4F_8$, or $CF_4$, but the base member gas 582 is not limited to such types of gas. Further, in the base member plasma etching step 1004 according to the first embodiment, the plasma etching apparatus 50 performs plasma etching on the base member 2 of the device wafer 1 by the Bosch method which alternately repeats plasma etching by supply of $SF_6$ and protective film deposition on an inner side surface and the like of the etching groove 14 by supply of $C_4F_8$. However, according to the present invention, plasma etching may be performed by supply of a single type of etching gas.

In the base member plasma etching step 1004, the plasma etching apparatus 50 has a predetermined length of time set in advance for performing plasma etching on the base member 2 of the device wafer 1, according to the thickness of the base member 2 of the device wafer 1. In the base member plasma etching step 1004, the plasma etching apparatus 50 applies high-frequency power to the holding unit 52 and the upper electrode 53 while supplying the base member gas 582, for a predetermined length of time, and, as illustrated in FIG. 10, completely removes the base member 2 exposed from the groove or opening 131 of the mask 13 on the street 5, thereby dividing the device wafer 1 along the groove or opening 131, that is, the etching groove 14, into individual device chips 10. More specifically, in the base member plasma etching step 1004, each of the etching grooves 14 is caused to penetrate the device wafer 1 over the entire length of each of the streets 5.

(Mask Removing Step)

Figure 11:
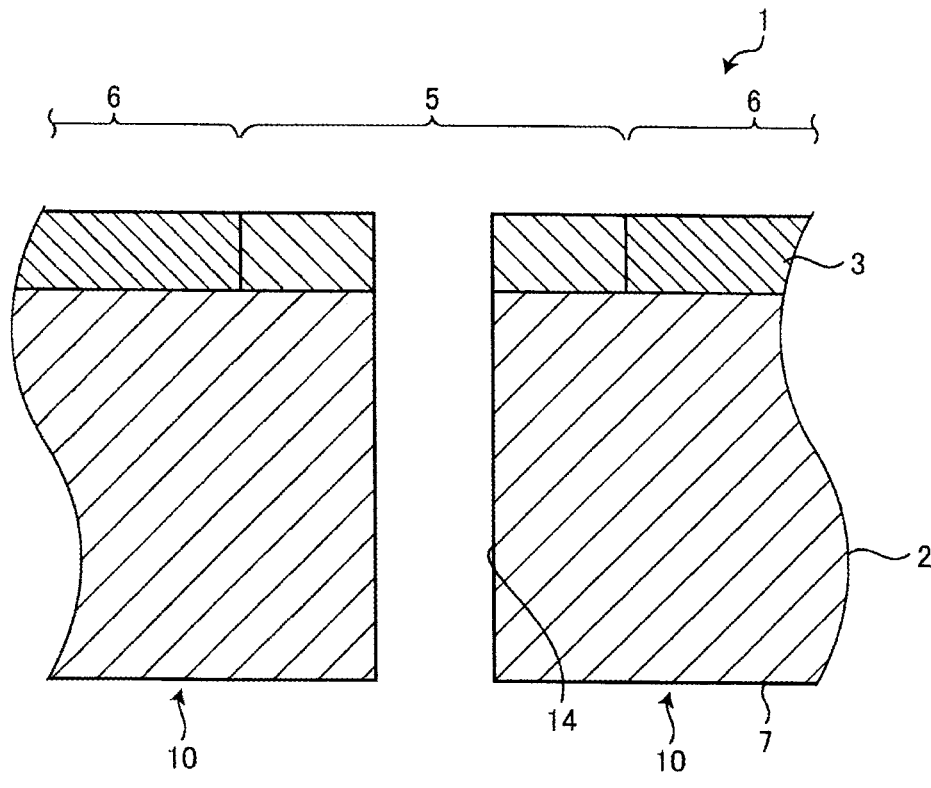
FIG. 11 is a cross sectional view schematically illustrating part of the device wafer that has undergone a mask removing step of the device wafer processing method illustrated in FIG. 2.

FIG. 11 is a cross sectional view schematically illustrating part of the device wafer that has undergone the mask removing step of the device wafer processing method illustrated in FIG. 2. The mask removing step 1005 is a step of, after the base member plasma etching step 1004 is carried out, removing the mask 13 from the face side 4 of the device wafer 1.

In the mask removing step 1005 according to the first embodiment, an unillustrated cleaning apparatus places the reverse side 7 of the device wafer 1 on a holding surface of a spinner table via the tape 8, holds the reverse side 7 of the device wafer 1 under suction on the holding surface via the tape 8, and clamps the annular frame 9 by clamps provided around the spinner table. In the mask removing step 1005 according to the first embodiment, the cleaning apparatus supplies a cleaning liquid which is, for example, purified water, to the center of the face side 4 of the device wafer 1 from a cleaning nozzle disposed on the upper side of the device wafer 1, while rotating the spinner table about its axis. Then, the cleaning water supplied to the face side 4 of the device wafer 1 flows toward the outer edge side of the device wafer 1 by the centrifugal force generated by rotation of the spinner table, and, as illustrated in FIG. 11, washes away the mask 13 from the face side 4 of the device wafer 1.

In this way, in the mask removing step 1005 according to the first embodiment, what is generally called spinner cleaning of cleaning the device wafer 1 by supplying a cleaning liquid to the device wafer 1 held on the spinner table that is rotating about its axis is performed. In the mask removing step 1005 according to the first embodiment, the device wafer 1 is dried, and the device wafer processing method is ended.

According to the device wafer processing method of the first embodiment described above, in the mask forming step 1002, the laser processing apparatus 30 removes the protective film 12 on each of the streets 5 and forms the mask 13 on the device wafer 1 by applying the laser beam 36 under such processing conditions that restrict removal of the device layer 3 on each of the streets 5, so that formation of debris protruding from the device layer 3 on the face side 4 of the device wafer 1 after the mask forming step 1002 can be restrained. Further, according to the device wafer processing method of the first embodiment, the device layer 3 on each of the streets 5 is removed in the device layer plasma etching step 1003.

Consequently, the device wafer processing method according to the first embodiment produces such an effect of restraining debris from protruding on the upper surface of the device layer 3 in each of the individual device chips 10.

Figure 12:
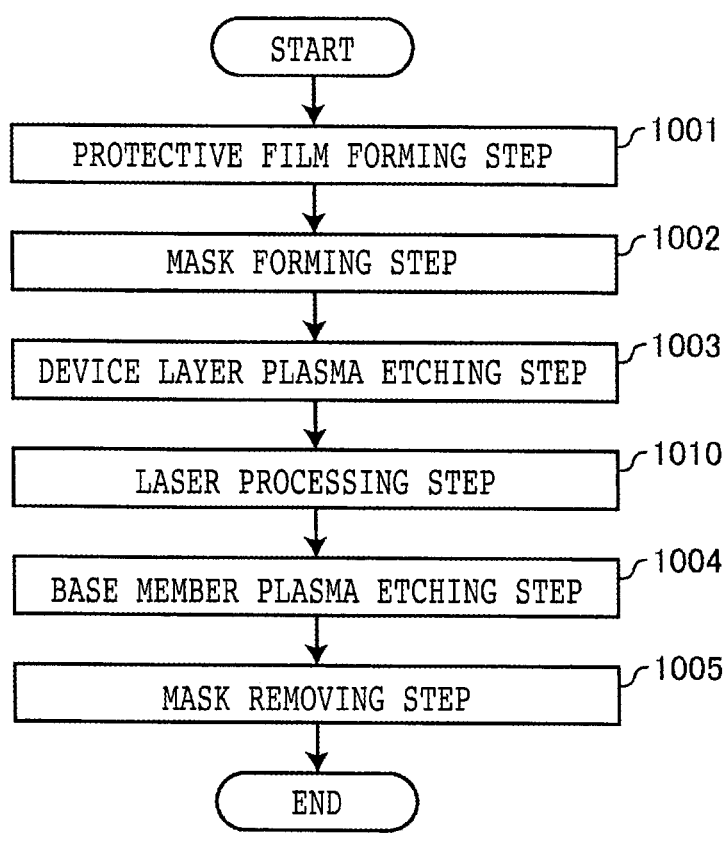
FIG. 12 is a flowchart illustrating a flow of the device wafer processing method according to a second embodiment of the present invention.
Figure 13:
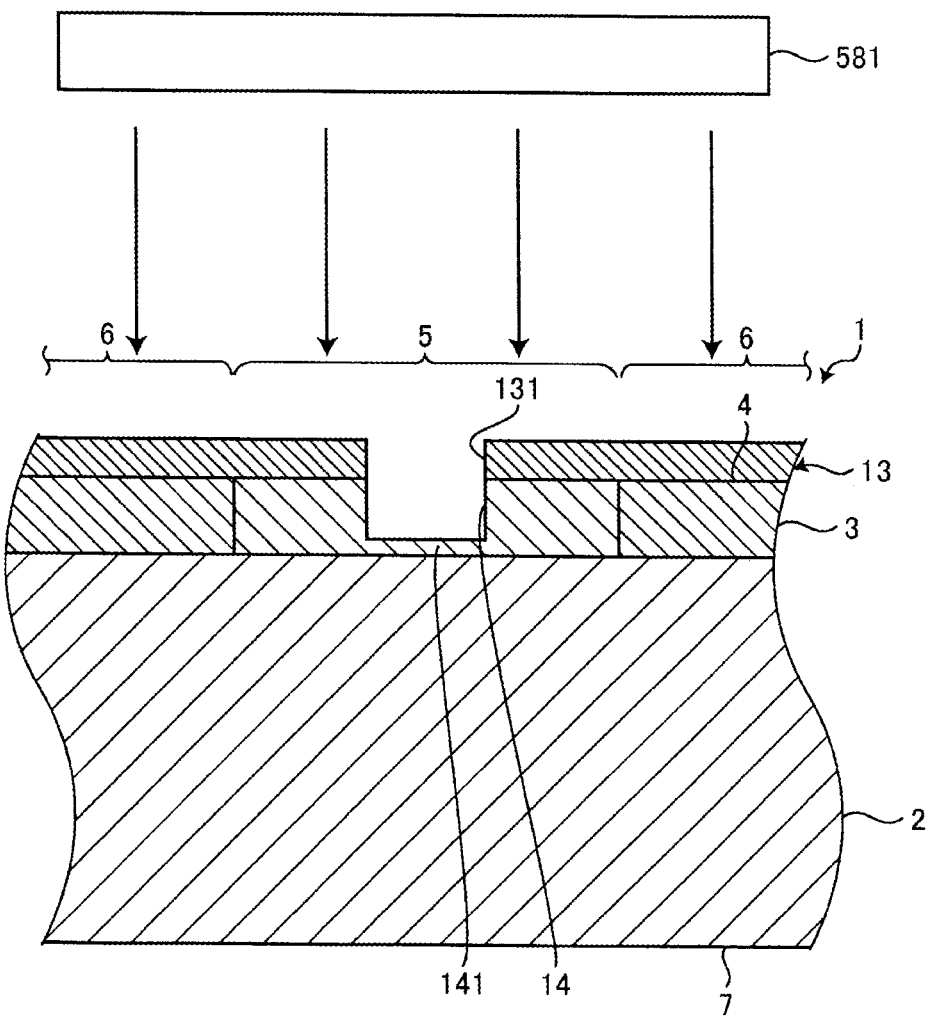
FIG. 13 is a cross sectional view of part of the device wafer schematically illustrating the device layer plasma etching step of the device wafer processing method illustrated in FIG. 12.
Figure 14:
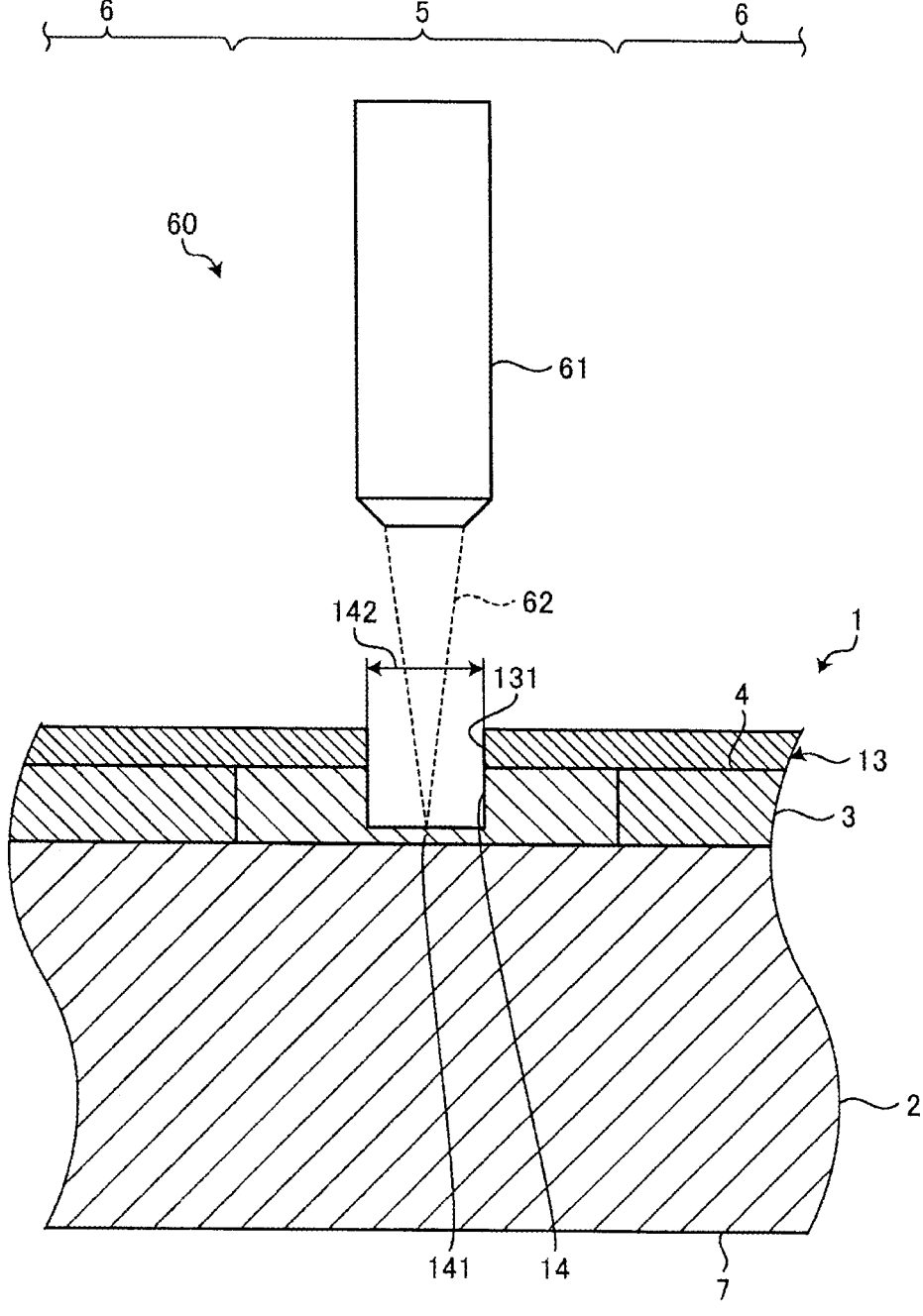
FIG. 14 is a cross sectional view of part of the device wafer schematically illustrating a laser processing step of the device wafer processing method illustrated in FIG. 12.
Figure 15:
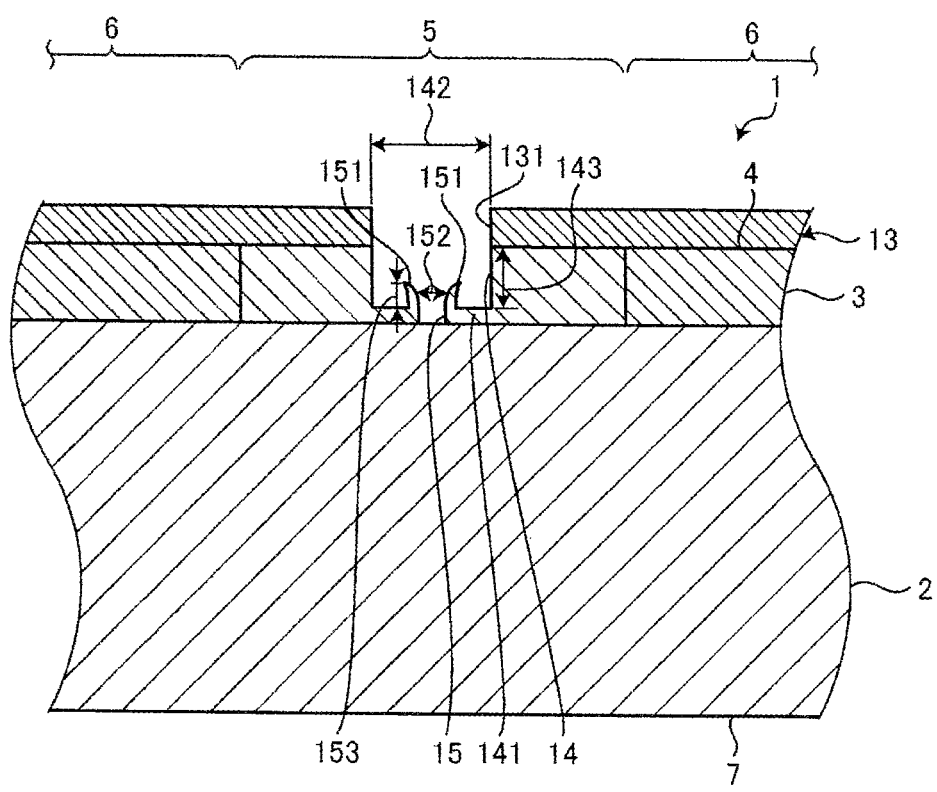
FIG. 15 is a cross sectional view schematically illustrating part of the device wafer that has undergone the laser processing step of the device wafer processing method illustrated in FIG. 12.
Figure 16:
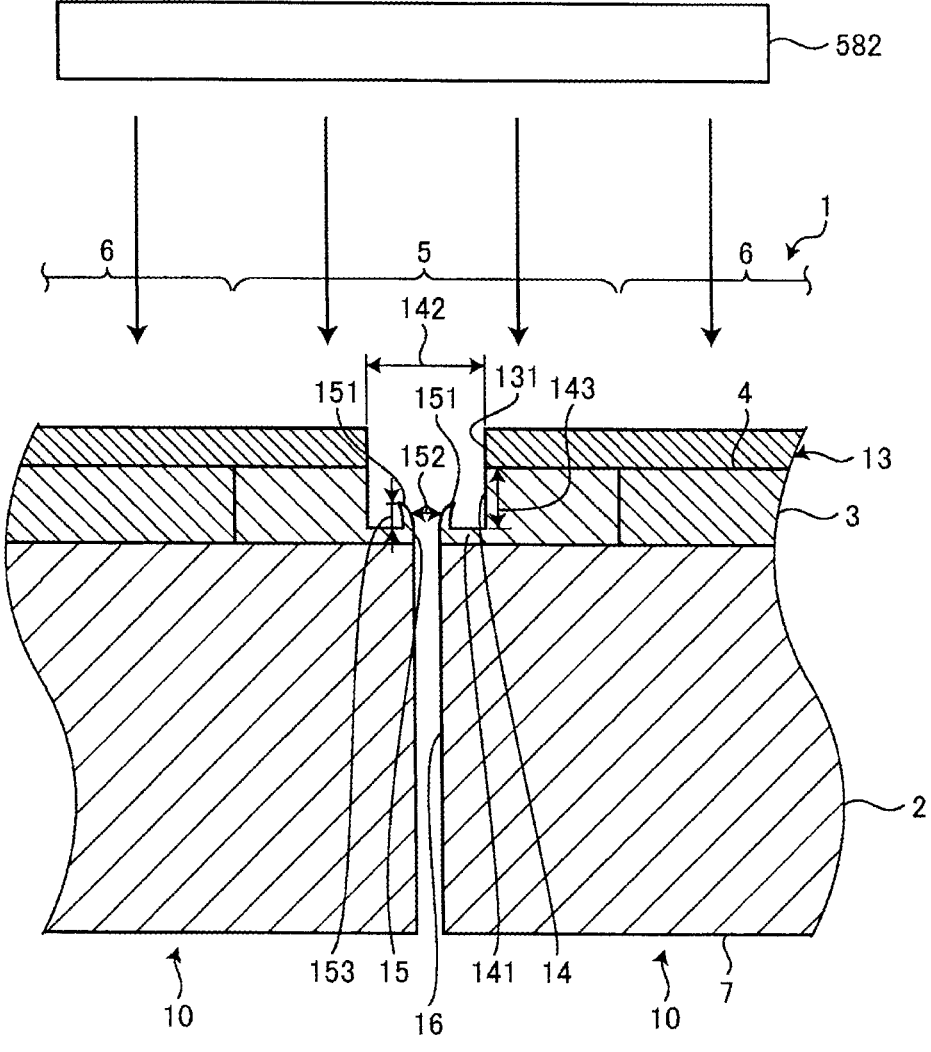
FIG. 16 is a cross sectional view of part of the device wafer schematically illustrating the base member plasma etching step of the device wafer processing method illustrated in FIG. 12.

Next, the device wafer processing method according to a second embodiment of the present invention will be described in reference to the drawings. FIG. 12 is a flowchart illustrating a flow of the device wafer processing method according to the second embodiment. FIG. 13 is a cross sectional view of part of the device wafer schematically illustrating the device layer plasma etching step of the device wafer processing method illustrated in FIG. 12. FIG. 14 is a cross sectional view of part of the device wafer schematically illustrating a laser processing step of the device wafer processing method illustrated in FIG. 12. FIG. 15 is a cross sectional view schematically illustrating part of the device wafer that has undergone the laser processing step of the device wafer processing method illustrated in FIG. 12. FIG. 16 is a cross sectional view of part of the device wafer schematically illustrating the base member plasma etching step of the device wafer processing method illustrated in FIG. 12. Note that, in FIGS. 12, 13, 14, 15, and 16, portions identical to those in the first embodiment are denoted by identical reference signs, and their description is omitted.

The device wafer processing method according to the second embodiment is the same as that of the first embodiment except for including the device layer plasma etching step 1003 and the base member plasma etching step 1004 that are different from those of the first embodiment and further including a laser processing step 1010, as illustrated in FIG. 12. In the second embodiment, the protective film forming step 1001 and the mask forming step 1002 are performed in a manner similar to that of the first embodiment.

In the device layer plasma etching step 1003 of the device wafer processing method according to the second embodiment, the plasma etching apparatus 50 applies high-frequency power to the holding unit 52 and the upper electrode 53 while supplying the device layer gas 581, for a second predetermined length of time, which is shorter than the predetermined length of time for removing the device layer 3 of the device wafer 1 over the entire thickness direction by the device layer gas 581 that has been turned into plasma gas, performs plasma etching on the device wafer 1 through the mask 13, and thereby forms the etching groove 14 in the device layer 3 on each of the streets 5 of the device wafer 1.

In this way, in the device layer plasma etching step 1003 of the device wafer processing method according to the second embodiment, the plasma etching apparatus 50 forms, in the device layer 3 on each of the streets 5, the etching groove 14 that does not reach the upper surface of the base member 2, that is, the etching groove 14 in which the device layer 3 is left at the bottom thereof, as illustrated in FIG. 13. In the device layer plasma etching step 1003 of the device wafer processing method according to the second embodiment, the plasma etching apparatus 50 forms a remaining portion 141 of the device layer 3 on the lower side of the etching groove 14 that is formed in the device layer 3 on each of the streets 5 of the device wafer 1.

The laser processing step 1010 is a step of, after the device layer plasma etching step 1003 is carried out but before the base member plasma etching step 1004 is performed, applying a laser beam 62 (illustrated in FIG. 14) to the remaining portion 141 of the device layer 3 to divide the remaining portion 141 and forming a laser processing groove 15 (illustrated in FIG. 15) that reaches the base member 2. In the laser processing step 1010 according to the second embodiment, a laser processing apparatus 60 illustrated in FIG. 14 holds the reverse side 7 of the device wafer 1 under suction on a holding surface of a chuck table via the tape 8 and clamps the annular frame 9 by clamps provided around the chuck table.

In the laser processing step 1010 according to the second embodiment, the laser processing apparatus 60 captures an image of the face side 4 of the device wafer 1 by an imaging camera and performs alignment of aligning the positions of the etching grooves 14 formed in the streets 5 of the device wafer 1 and a condenser lens of a laser beam application unit 61. In the laser processing step 1010 according to the second embodiment, the laser processing apparatus 60 sets the focal point of the laser beam 62 to a face side of the remaining portion 141 on the bottom of the etching groove 14, while moving the chuck table and the laser beam application unit 61 relative to each other along the etching groove 14 formed in each of the streets 5, and applies the laser beam 62 having a wavelength absorbable by the device layer 3 toward the bottom of each of the etching grooves 14 formed in the streets 5. The laser processing apparatus 60 thereby removes the remaining portion 141 on the bottom of each of the etching grooves 14 formed in the streets 5 and forms the laser processing groove 15 that divides the device layer 3 and reaches the base member 2 on the bottom of the remaining portion 141, to divide the device layer 3 along the streets 5. Note that a groove width 152 of the laser processing groove 15 is narrower than a groove width 142 of the etching groove 14.

In the laser processing step 1010, when the remaining portion 141 formed on the bottom of the etching groove 14 in each of the streets 5 is divided, as illustrated in FIG. 15, debris 151 that is configured from the device layer 3 and that protrudes from the bottom of the laser processing groove 15 adheres to both edges of the laser processing groove 15 in the width direction thereof. In the laser processing step 1010 according to the second embodiment, the laser processing apparatus 60 forms, on the bottom of each of the etching grooves 14 formed in the streets 5, the laser processing groove 15 that has the groove width 152 narrower than the groove width 142 of the etching groove 14 and that reaches the base member 2 and applies the laser beam 62 to the device wafer 1 under such processing conditions that a height 153 of the debris 151 from the bottom of the etching groove 14 is smaller than a depth 143 of the etching groove 14 from the face side 4, to divide the device layer 3 on each of the streets 5 of the device wafer 1. As described above, in the second embodiment, the groove width 152 of the laser processing groove 15 is formed to be narrower than the groove width 142 of the etching groove 14, and the depth 143 of the etching groove 14 is set to such a depth that the debris 151 formed in the laser processing step 1010 does not protrude (that is, the debris 151 is restricted from protruding) from the upper surface of the device layer 3.

In the base member plasma etching step 1004 according to the second embodiment, the plasma etching apparatus 50 performs etching (what is generally called plasma etching) on the base member 2 exposed on the bottom of the laser processing groove 15, by the base member gas 582 that has been turned into plasma gas, as illustrated in FIG. 16, forms a second etching groove 16 on the bottom of the laser processing groove 15, and causes the second etching groove 16 to advance toward the reverse side 7 of the device wafer 1. Note that, in the base member plasma etching step 1004 according to the second embodiment, as in the first embodiment, the base member 2 of the device wafer 1 is subjected to plasma etching by the Bosch method and the base member 2 exposed from the laser processing groove 15 in each of the streets 5 is completely removed, so that the device wafer 1 is divided along the laser processing groove 15, that is, the second etching groove 16, into individual device chips 10.

The device wafer processing method according to the second embodiment performs the mask removing step 1005 after the base member plasma etching step 1004 is performed, as in the first embodiment.

According to the device wafer processing method according to the second embodiment, the laser processing apparatus 30 applies the laser beam 36 to form the mask 13 on the device wafer 1 in the mask forming step 1002 and performs plasma etching on the device layer 3 on each of the streets 5 in the device layer plasma etching step 1003. Hence, similarly to the first embodiment, the second embodiment produces the effect of restraining debris from protruding from the upper surface of the device layer 3 in the individual device chips 10.

Further, although the device wafer processing method according to the second embodiment requires time to perform plasma etching on the device layer 3, the device layer plasma etching step 1003 performs plasma etching until a midpoint of the device layer 3 is reached and the laser processing step 1010 divides the remaining portion 141 by application of the laser beam 62, so that the processing time can be reduced compared to a case where plasma etching is performed on the entire thickness of the device layer 3.

Further, in the device wafer processing method according to the second embodiment, the groove width 152 of the laser processing groove 15 formed in the remaining portion 141 is narrower than the groove width 142 of the etching groove 14, and the debris 151 formed in the laser processing step 1010 is formed on the remaining portion 141 of the device layer 3 on the bottom of the etching groove 14. Furthermore, in the device wafer processing method according to the second embodiment, the depth 143 of the etching groove 14 is set to be greater than the height 153 of the debris 151. Consequently, the device wafer processing method according to the second embodiment can restrain the debris 151 formed in the laser processing step 1010 from protruding from the upper surface of the device layer 3.

Note that the present invention is not limited to the abovementioned embodiments. That is, the present invention can be implemented with various modifications within a scope not departing from the gist of the present invention. In the present invention, the protective film 12 may, for example, be a non-water soluble film such as a resist film. In that case, the protective film 12 is removed by asking using oxygen gas, for example, in the mask removing step 1005.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device wafer processing method for a device wafer in which a device layer configuring devices is stacked on a base member and which has each of the devices formed in each of areas on a face side demarcated by a plurality of streets in crisscross relation, the method comprising:
   a protective film forming step of forming a protective film that covers the face side of the device wafer;
   a mask forming step of, after the protective film forming step is carried out, applying a laser beam along the streets and forming, in the protective film, a mask that has grooves extending along the streets;
   a device layer plasma etching step of, after the mask forming step is carried out, performing plasma etching on the device layer of the device wafer by device layer gas through the mask; and
   a base member plasma etching step of, after the device layer plasma etching step is carried out, performing plasma etching on the base member by base member gas through the mask, and
   wherein the device layer gas used during the device layer plasma etching step is different from the base member gas used during the base member plasma etching step.

2. The device wafer processing method according to claim 1, wherein the device layer gas comprises $CF_4$.

3. The device wafer processing method according to claim 1, wherein the device layer gas comprises $C_4F_8$.

4. The device wafer processing method according to claim 1, wherein the base member gas comprises $SF_6$.

5. The device wafer processing method according to claim 1, wherein:
   the device layer gas comprises $CF_4$; and
   the base member gas comprises $SF_6$.

6. A device wafer processing method for a device wafer in which a device layer configuring devices is stacked on a base member and which has each of the devices formed in each of areas on a face side demarcated by a plurality of streets in crisscross relation, the method comprising:

a protective film forming step of forming a protective film that covers the face side of the device wafer;

a mask forming step of, after the protective film forming step is carried out, applying a laser beam along the streets and forming, in the protective film, a mask that has grooves extending along the streets;

a device layer plasma etching step of, after the mask forming step is carried out, performing plasma etching on the device layer of the device wafer by device layer gas through the mask; and a base member plasma etching step of, after the device layer plasma etching step is carried out, performing plasma etching on the base member by base member gas through the mask, and in the device layer plasma etching step, etching grooves that do not reach an upper surface of the base member are formed in the device layer, and a remaining portion of the device layer is formed on a lower side of each of the etching grooves, wherein the device wafer processing method further includes a laser processing step of, after the device layer plasma etching step is carried out but before the base member plasma etching step is performed, applying a laser beam to the remaining portion of the device layer and forming laser processing grooves that divide the remaining portion and that reach the base member, and wherein a groove width of each of the laser processing grooves is formed to be narrower than a groove width of each of the etching grooves, and a depth of each of the etching grooves is set to such a depth that debris formed in the laser processing step does not protrude from an upper surface of the device layer.

7. A device wafer processing method for a device wafer in which a device layer configuring devices is stacked on a base member and which has each of the devices formed in each of areas on a face side demarcated by a plurality of streets in crisscross relation, the method comprising:

a protective film forming step of forming a protective film that covers the face side of the device wafer;

a mask forming step of, after the protective film forming step is carried out, applying a laser beam along the streets and forming, in the protective film, a mask that has grooves extending along the streets;

a device layer plasma etching step of, after the mask forming step is carried out, performing plasma etching on the device layer of the device wafer by device layer gas through the mask, wherein the device layer gas is received from a first etching gas supply source; and a base member plasma etching step of, after the device layer plasma etching step is carried out, performing plasma etching on the base member by base member gas through the mask, wherein the base member gas is received from a second etching gas supply source;

wherein the first etching gas supply source is different from the second etching gas supply source.

8. The device wafer processing method according to claim 7, wherein the device layer gas comprises $CF_4$.

9. The device wafer processing method according to claim 7, wherein the device layer gas comprises $C_4F_8$.

10. The device wafer processing method according to claim 7, wherein the base member gas comprises $SF_6$.

11. The device wafer processing method according to claim 7, wherein:

the device layer gas comprises $CF_4$; and the base member gas comprises $SF_6$.

* * * * *